(12) United States Patent  (10) Patent No.: US 8,836,021 B2
Nagata  (45) Date of Patent: Sep. 16, 2014

(54) SEMICONDUCTOR DEVICE

(75) Inventor: Masaki Nagata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 199 days.

(21) Appl. No.: 13/366,259

(22) Filed: Feb. 3, 2012

(65) Prior Publication Data

US 2012/0199901 A1    Aug. 9, 2012

(30) Foreign Application Priority Data

Feb. 4, 2011 (JP) .................. 2011-022987

(51) Int. Cl.
*H01L 29/66* (2006.01)
*H01L 29/417* (2006.01)
*H01L 29/45* (2006.01)
*H01L 29/78* (2006.01)
*H01L 29/08* (2006.01)

(52) U.S. Cl.
CPC ...... *H01L 29/0865* (2013.01); *H01L 29/41741* (2013.01); *H01L 29/456* (2013.01); *H01L 29/0869* (2013.01); *H01L 29/7813* (2013.01); *H01L 29/66734* (2013.01)
USPC ................... 257/330; 257/E29.257

(58) Field of Classification Search
None
See application file for complete search history.

(56) References Cited

U.S. PATENT DOCUMENTS

| | | | |
|---|---|---|---|
| 5,498,558 A * | 3/1996 | Kapoor ................... | 438/260 |
| 6,351,009 B1 * | 2/2002 | Kocon et al. ............. | 257/328 |
| 2003/0096482 A1 * | 5/2003 | Hao et al. ................ | 438/303 |
| 2006/0054970 A1 * | 3/2006 | Yanagida et al. ........ | 257/330 |
| 2007/0114600 A1 * | 5/2007 | Hirler et al. ............. | 257/330 |
| 2011/0169075 A1 * | 7/2011 | Hsieh ...................... | 257/330 |

FOREIGN PATENT DOCUMENTS

JP    2006-202931 A    8/2006

* cited by examiner

*Primary Examiner* — Michael Lebentritt
*Assistant Examiner* — Kevin Quinto
(74) *Attorney, Agent, or Firm* — Rabin & Berdo, P.C.

(57) ABSTRACT

A semiconductor device includes an active region, a gate conductor and a source electrode. The active region includes a drain region, a channel region stacked on the drain region, and a source region stacked on the channel region. The active region is formed of a silicon semiconductor layer. The gate conductor is embedded within a trench, which is formed from the source region to the drain region penetrating through the channel region. The source electrode is formed to come in contact with the source region and includes an adhesion layer. The source electrode is formed of a metal layer having a film thickness of 150 Å or smaller. The interface between the source electrode and the source region is silicidized.

17 Claims, 17 Drawing Sheets

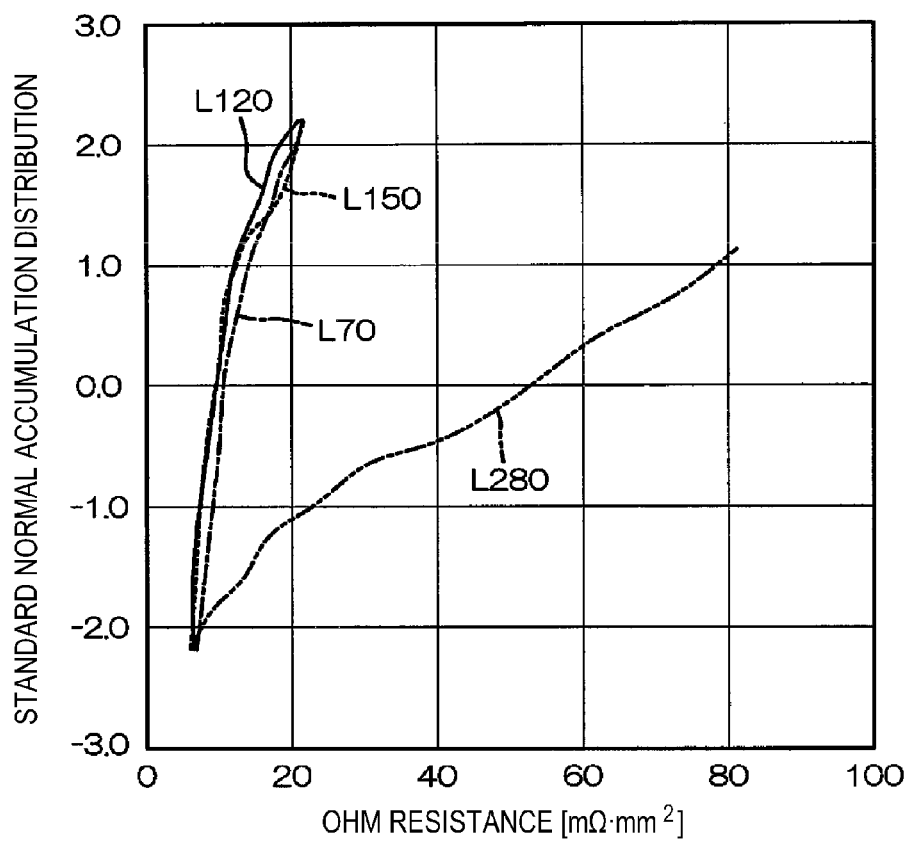

SEM IMAGE OF SECTION

SEM IMAGE OF UPPER SURFACE

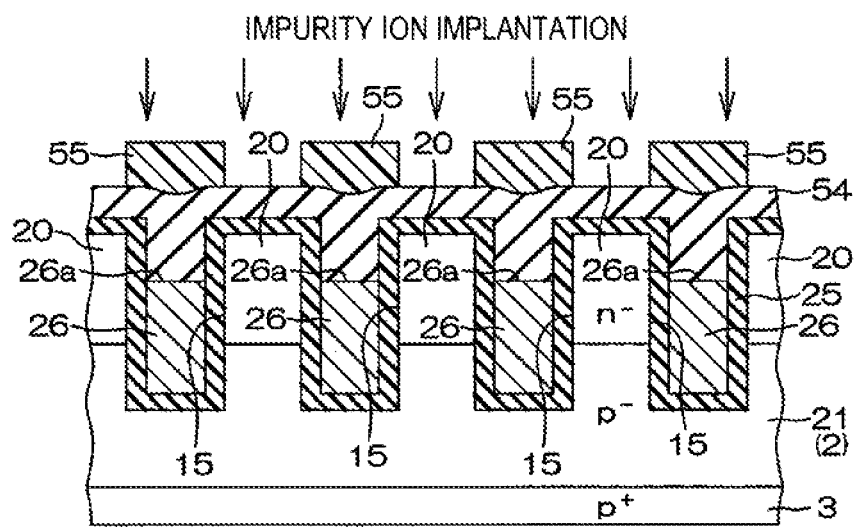
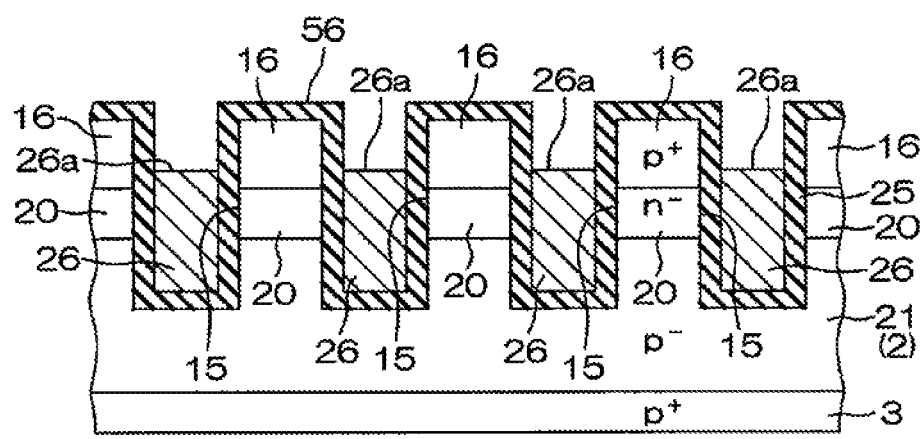

SEMICONDUCTOR DEVICE

CROSS-REFERENCE TO RELATED APPLICATION

This application is based upon and claims the benefit of priority from Japanese Patent Application No. 2011-22987, filed on Feb. 4, 2011, the entire contents of which are incorporated herein by reference.

TECHNICAL FIELD

The present disclosure relates to a semiconductor device having a trench gate type transistor.

BACKGROUND

A trench gate type power metal-insulator-semiconductor field-effect-transistor (MISFET) includes a semiconductor substrate, an epitaxial layer (semiconductor layer) formed on the semiconductor substrate, and a plurality of trenches formed on the epitaxial layer. A channel region (body region) and a source region are formed in the epitaxial layer. For example, when the epitaxial layer is an n type layer, the channel region is a p type and the source region is an n type. The channel region is formed in a region from a surface of the epitaxial layer to a certain depth. The source region is formed on a surface portion of the channel region. The trenches pass through the source region and the channel region to reach the epitaxial layer. A gate conductor formed of polysilicon is disposed within the trenches. Inner walls of the trenches are covered by a gate insulating film. Thus, the gate conductor is opposite the channel region, while having the gate insulating film interposed therebetween. In this manner, an MIS structure is formed. When a control voltage having a threshold value or higher is applied to the gate conductor, an inversion layer (channel) is formed at a portion opposite the trenches in the channel region. Thereby, a current path is formed starting from the epitaxial layer (drain region) under the channel region, through the channel region, to the source region.

The trench gate type power MISFET has a structure in which current flows in a thickness direction of the semiconductor substrate, and thus a width of the gate per unit area of the semiconductor substrate may be increased. Thus, this structure is advantageous in reducing ON resistance.

A plurality of trenches may be formed to have, for example, a stripe shape. In this case, for example, a single trench and the epitaxial layer at one side may be regarded as a unit cell. In the power MISFET, a source region of the plurality of unit cells arranged on the semiconductor substrate is commonly connected to a source electrode. An interval (space) between the trenches is called a cell pitch. A current density per unit area can be increased by increasing an integration density of the unit cells through reduction of the cell pitch, by which theoretically the ON resistance can be further reduced.

However, the research conducted by the inventor of the present disclosure indicates that the ON resistance is not reduced as much as theoretically expected although the cell pitch is reduced. Details thereof are as follows.

With respect to a semiconductor device having a source electrode of a stacking structure including an adhesion layer and an electrode main body layer, the inventor of the present disclosure has manufactured a plurality of samples having different cell pitches and reviewed the manufactured samples. As a result, in a sample having a reduced cell pitch, a void was created between the adhesion layer and an active region in trenches (an epitaxial layer having a source region on the top surface thereof).

More specifically, to make an ohmic-contact between the adhesion layer and the active region, thermal treatment is executed after the source electrode is formed. Accordingly, the adhesion layer reacts with silicon of the active region to be silicidized. However, if supply of silicon to the adhesion layer is insufficient, it causes a void to be created between the adhesion layer and the active region.

If the contact area between the adhesion layer and the active region is reduced, the number of atoms which are silicidized among the metal atoms constituting the adhesion layer is reduced, resulting in suppression of the creation of a void. However, in terms of securing required reliability, the contact area between the adhesion layer and the active region should be increased to ensure an electrical connection between the source electrode and the active region. If the contact area is increased, the number of atoms that are silicidized among the metal atoms constituting the adhesion layer is increased. However, a void may be created due to a shortage of silicon supply, because a sufficient number of silicon atoms may not be supplied from the active region having a small width within trenches. Thus, contact resistance between the source electrode and the active region is increased, and as a result, ON resistance cannot be reduced.

In this manner, when the cell pitch is reduced, it is difficult to reduce ON resistance while securing reliability.

SUMMARY

The present disclosure provides some embodiments of a trench gate type semiconductor device capable of reducing ON resistance without sacrificing reliability.

According to one embodiment of the present disclosure, a semiconductor device is provided. The semiconductor includes an active region, a gate conductor and a source electrode. The active region includes a drain region, a channel region stacked on the drain region, and a source region stacked on the channel region. The active region is formed of a silicon semiconductor layer. The gate conductor is embedded within a trench, which is formed extending from the source region to the drain region and penetrating through the channel region. The source electrode including an adhesion layer is formed to come in contact with the source region. The source electrode is formed of a metal layer having a film thickness of 150 Å or less. The interface between the source electrode and the source region is silicidized.

In this configuration, the gate conductor embedded within the trench faces the channel region between the source region and the drain region. Accordingly, the trench gate type semiconductor device (transistor structure) is formed, which is capable of modulating a current flowing between the source region and the drain region by a voltage applied to the gate conductor.

Meanwhile, the adhesion layer in contact with the active region (source region) is formed of a metal layer having a film thickness of 150 Å or less (specifically, 120 Å or less, and more specifically, 70 Å or less). The interface between the adhesion layer and the source region is silicidized. In the metal layer having a film thickness of 150 Å or less, although the contact area of the active region is large, the number of metal atoms that are silicidized is small. For this reason, during silicidation, a shortage of silicon atom supply from the active region (silicon semiconductor layer) can be restrained or prevented. Accordingly, creation of a void in the interface between the active region and the adhesion layer can be restrained or prevented. As a result, contact resistance between the active region and the source electrode can be reduced, thereby reducing ON resistance. In other words, ON resistance can be reduced while securing reliability by increasing the contact area between the active region and the source electrode. More specifically, although the width of the active region is reduced to obtain an increased current density, a creation of a void between the source electrode and the active region can be restrained without reducing the contact area therebetween. Thus in some embodiments, a semiconductor device having high reliability and low ON resistance can be provided.

The adhesion layer may have a film thickness of 20 Å or greater (more specifically 40 Å or greater). This makes for good adhesion formed between the source electrode and the active region. Also, a silicide layer having a sufficient thickness to reduce contact resistance between the source electrode and the active region can be formed in the interface of the source electrode and the active region.

In this configuration, a plurality of trenches is disposed at intervals. The active region between adjacent trenches has a width of 0.18 μm to 0.30 μm (more specifically 0.18 μm to 0.24 μm). The silicon supply window with respect to the adhesive layer is limited, because the active region between adjacent trenches has a width of 0.18 μm or greater and 0.30 μm or less. Even in this case, the adhesion layer may be configured as a metal layer having a thickness of 150 Å or smaller, such that silicon supply during silicidation can be restrained or prevented. Thus, since it is possible to reduce channel resistance and the contact resistance between the active region and the source electrode resistance by integrating the narrow active region with high density, ON resistance of the semiconductor device can be effectively reduced.

In the case of an active region having a width less than 0.18 μm, a depletion layer spreading from a neighboring trench is easily coupled, thus there is a possibility in which a threshold voltage value will be lowered. In other words, when a voltage is applied to the gate conductor, a majority of carriers within the channel region move away from the gate conductor, generating a depletion layer. Further, the density of minority carriers is increased to be higher than that of majority carriers, thus an inversion layer (channel) is formed within the channel region in the vicinity of a trench side wall. With this configuration, however, if the width of the active region becomes significantly small, the depletion layer spreading from a neighboring trench is easily coupled to form an inversion layer with a low voltage. This lowers a threshold value.

When the width of the active region exceeds 0.30 μm, although the adhesion layer is a metal layer having a thickness greater than 150 Å, a void can hardly be created. Thus, if the width of the active region is 0.30 μm or less, the advantageous effect of the above embodiment may be enhanced.

In another embodiment, the insulating layer embedded in a region on the gate conductor within the trench is further included. The active region has a protrusion formed in a depth direction of the trench by a protrusion amount of 25 nm to 125 nm from a surface of the insulating layer. With this configuration, since the active region is protruded from a surface of the insulating layer within a trench, although the width of the active region is reduced, the contact area between the active region and the adhesion layer can be increased. Even in the case of securing the large contact area, since the adhesion layer is configured as a metal layer having a thickness of 150 Å or smaller, a silicon supply shortage during silicidation can be restrained or prevented.

When a protrusion amount of the active region is less than 25 nm, there is a possibility in which the contact area between the active region and the adhesion layer is insufficient, resulting in reduced reliability of an electrical connection between the active region and the source electrode. Further, when the protrusion amount of the active region exceeds 125 nm, coverage of the adhesion layer with respect to the protrusion of the active region may deteriorate.

In yet another embodiment, a repeating unit including the trench and the active region is repeatedly formed by a pitch of 0.4 μm to 0.52 μm (more specifically 0.4 μm to 0.49 μm) in a direction perpendicular to a depth direction of the trench. With this configuration, a repeating unit (unit cell) including the trench and the active region is formed to have high density at a fine pitch (0.4 μm or greater and 0.52 μm or less), the gate width per unit area can be increased to reduce channel resistance. Moreover, although the width of the active region is reduced by reducing a pitch, a silicon supply shortage with respect to the adhesion layer formed of a metal layer having a thickness of 150 Å or smaller can be restrained or prevented.

In some embodiments when the pitch is smaller than 0.4 μm, the threshold value voltage may be lowered due to coupling of a depletion layer spreading from the neighboring trench into the active region. Further, if the pitch exceeds 0.52 μm, although the adhesion layer is a metal layer having a thickness exceeding 150 Å, a void can hardly be created, since the width of the active region can be increased. Thus in some embodiments, if the pitch is 0.52 μm or smaller, the advantageous effect according to the above embodiment becomes prominent.

In still another embodiment, the metal layer forming the adhesion layer is a Ti layer, a Co layer, or an Ni layer. Upon receiving silicon atoms supplied from the active region formed of the silicon semiconductor layer, these metal layers can be silicidized in the interface of the source region (active region).

According to another embodiment of the present disclosure, a trench gate type semiconductor device is provided. The trench gate type semiconductor device includes an active region, a gate conductor, an insulating layer, and a source electrode. The active region includes a drain region, a channel region stacked on the drain region, and a source region stacked on the channel region. The active region is formed of a silicon semiconductor layer. The gate conductor is embedded within a trench. The trench is formed from the source region to the drain region penetrating through the channel region. The insulating layer is buried within a region on the gate conductor in the trench. Further, the source electrode electrically is connected to the source region. The source region includes a protrusion protruded in a depth direction of the trench higher than the surface of the insulating layer. The source electrode is configured to come in contact with the protrusion and includes an adhesion layer, a barrier layer stacked on the adhesion layer and an electrode layer stacked on the barrier layer. The interface between the protrusion and the adhesion layer is silicidized. The width of the adhesion layer is smaller than that of the barrier layer.

According to yet another embodiment of the present disclosure, a semiconductor device is provided. The semiconductor device includes an active region, a gate conductor, an insulating layer and a source electrode. The active region includes a drain region, a channel region stacked on the drain region, and a source region stacked on the channel region. The active region is formed of a silicon semiconductor layer. The gate conductor is embedded within a trench through an insulation film. The trench is formed from the source region to the drain region penetrating through the channel region. The insulating layer is embedded within a region on the gate conductor in the trench. The source electrode is electrically connected to the source region. The source region includes a protrusion protruded in a depth direction of the trench from the surface of the insulating layer. The source electrode includes an adhesion layer in contact with the protrusion, a barrier layer stacked on the adhesion layer and an electrode layer stacked on the barrier layer. In addition, the width of the adhesion layer is smaller than that of the barrier layer.

BRIEF DESCRIPTION OF THE DRAWINGS

FIG. 7 is a view showing the results obtained by measuring ON resistance with respect to a plurality of samples of the semiconductor device, in which a standard normal accumulation distribution is illustrated.

FIG. 10G is a schematic sectional view showing a process subsequent to FIG. 10F.

FIG. 10H is a schematic sectional view showing a process subsequent to FIG. 10G.

DETAILED DESCRIPTION

Exemplary embodiments of the present disclosure will now be described in detail with reference to the drawings.

Figure 1:
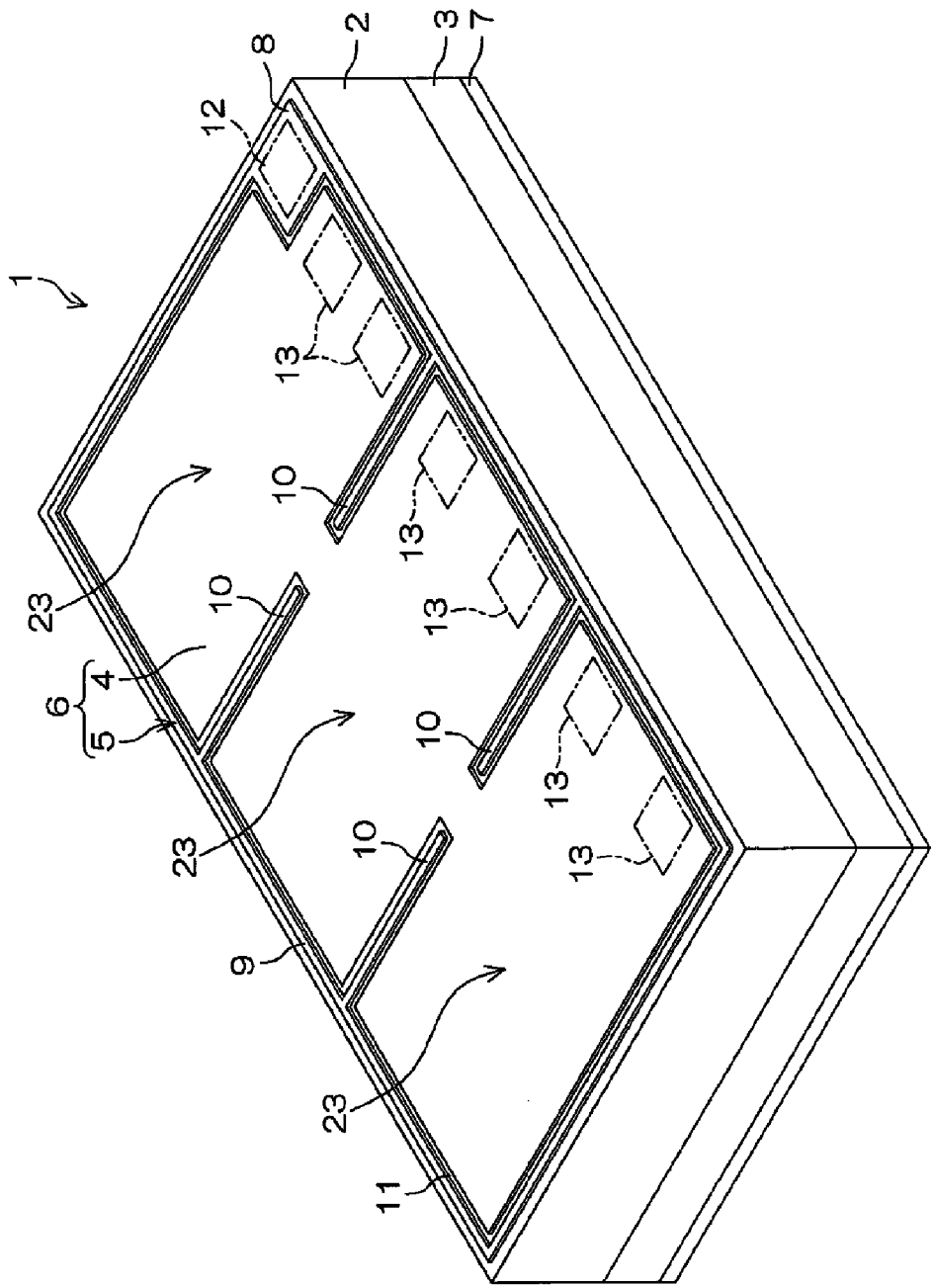
FIG. 1 is a schematic perspective view of a semiconductor device related to an embodiment of the present disclosure.
Figure 2:
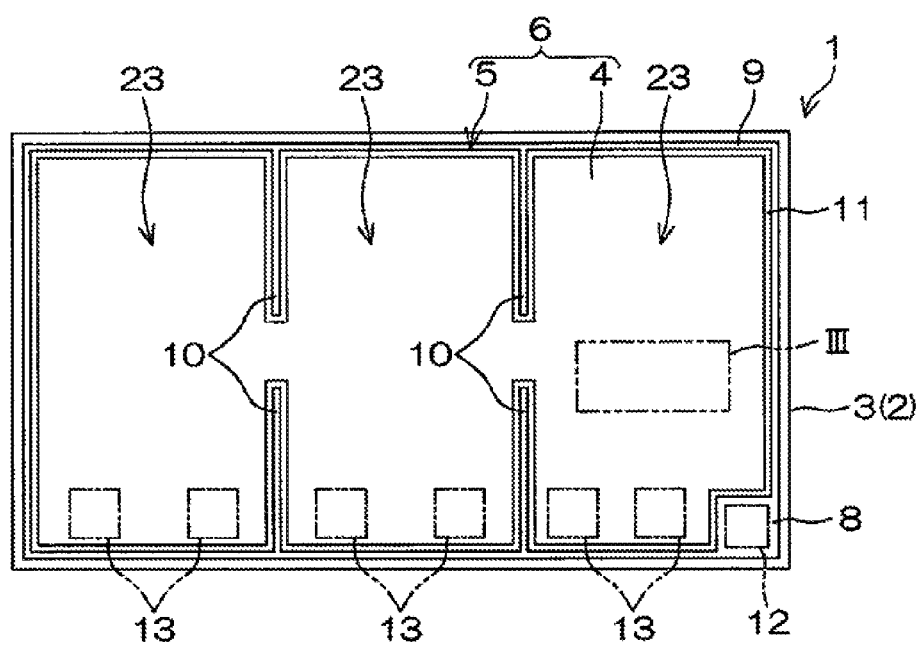
FIG. 2 is a schematic plan view of the semiconductor device.

FIG. 1 is a schematic perspective view of a semiconductor device 1 related to an embodiment of the present disclosure. FIG. 2 is a schematic plan view of the semiconductor device 1. The semiconductor device 1 has a basic shape as a trench gate type vertical double diffused MOSFET (VDMOSFET). The semiconductor device 1 includes a $p^+$ type silicon substrate 3 with an epitaxial layer 2 formed on a surface thereof. On the epitaxial layer 2, an electrode film 6 including a source electrode 4 and a gate electrode 5 is formed. An electrode film 6 including a source electrode 4 and a gate electrode 5 is formed on the epitaxial layer 2. A drain electrode 7 is formed on almost the entire surface of a rear surface of the silicon substrate 3. The silicon substrate 3 is formed to have, for example, a rectangular shape in terms of a plan view, and accordingly, the semiconductor device 1 has a rectangular shape in terms of a plan view.

The electrode film 6 is formed in a rectangular area over almost the entire area of the surface of the epitaxial layer 2. The gate electrode 5 includes a pad electrode part 8 formed at one corner portion of the semiconductor device 1, an outer circumferential electrode part 9 formed on the entire circumferential portion of the surface of the semiconductor device 1, and a plurality of (four in this embodiment) gate finger parts 10 extending toward an inner region of the surface of the semiconductor device 1 from the outer circumferential electrode part 9. The surface of the semiconductor device 1 has a rectangular shape having a pair of shorter sides and a pair of longer sides coupling the pair of shorter sides, and accordingly, the outer circumferential electrode part 9 has a rectangular shape. The gate finger parts 10 are formed to extend to be parallel two by two with a predetermined space from a pair of longer side portions of the outer circumferential electrode part 9. The source electrode 4 is formed to be insulated from the gate electrode 5 in the inner region surrounded by the outer circumferential electrode part 9. The source electrode 4 is formed to cover almost the entire epitaxial layer 2 in the region surrounded by the gate electrode 5. A separation region 11 is formed to insulate the source electrode 4 and the gate electrode 5 and is disposed between them.

A passivation film (not shown) is formed to cover the source electrode 4, the gate electrode 5, and the surface of the epitaxial layer 2 exposed therefrom. As shown by the two point chain line in FIGS. 1 and 2, a gate pad opening 12 and source pad openings 13 are formed on the passivation film. The gate pad opening 12 is formed to expose a portion of the pad electrode part 8. The source pad openings 13 are formed to expose portions of the surface of the source electrode 4. In this embodiment, a plurality of (e.g., 6) source pad openings 13 are arranged along one longer side of the rectangular surface of the semiconductor device 1.

Figure 3:
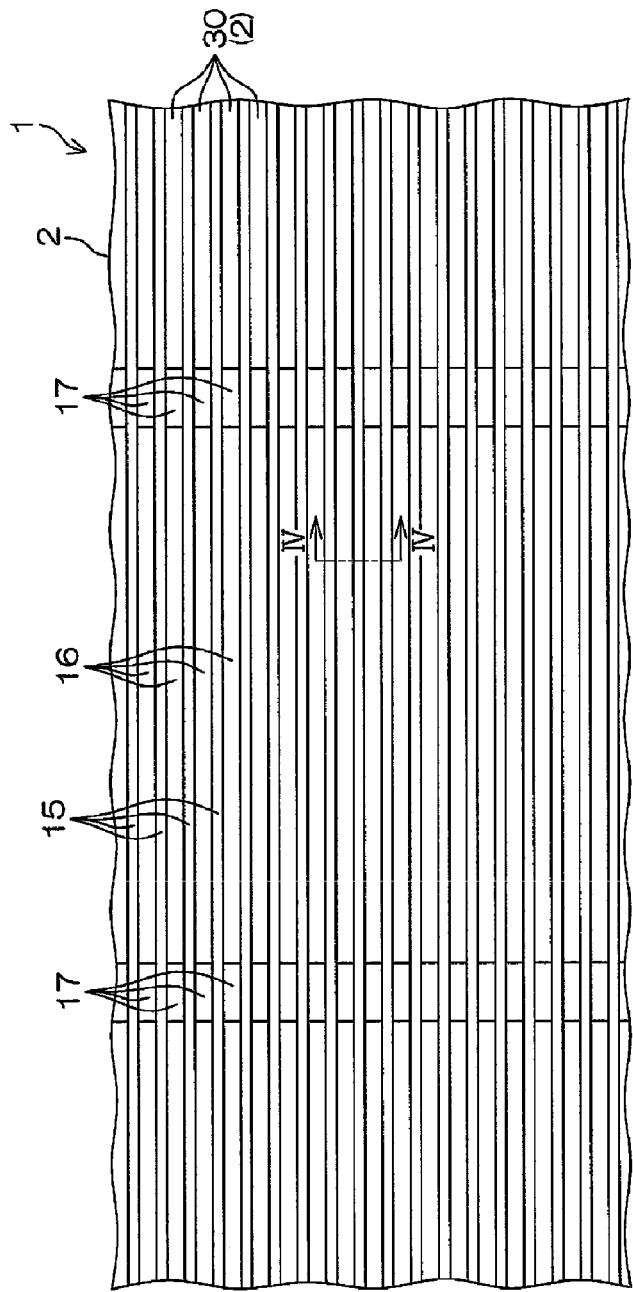
FIG. 3 is a partial enlarged view showing the structure of a silicon substrate (surface of an epitaxial layer) of the semiconductor device, in which the structure of a region III in FIG. 2 illustrated.

FIG. 3 is a partial enlarged view showing the structure of the surface of the silicon substrate 3 (the surface of the epitaxial layer 2) without the electrode film 6, in which the structure of a region III in FIG. 2 is illustrated. Trenches 15 are formed in the epitaxial layer 2. In this embodiment, a plurality of trenches 15 is formed to have a stripe shape. Each trench 15 has a linear shape following the surface of the epitaxial layer 2, and the plurality of trenches 15 are formed to be parallel with equal space in this embodiment.

The epitaxial layer 2, i.e., an active region 30, is exposed between the adjacent trenches 15. The active region 30 includes a source region 16 and a body contact region 17. The source region 16 is placed at a p$^+$ type region. The body contact region 17 is disposed at an n$^+$ type region. The source region 16 and the body contact region 17 have a predetermined length in the direction along the trenches 15, respectively, and they are formed such that the length of the source region 16 is greater than that of the body contact region 17. For example, the length of the source region 16 may be about 10.0 μm, and that of the body contact region 17 may be 1.0 μm. A plurality of body contact regions 17 are formed with equal space in a longitudinal direction of the trenches 15 such that they are interposed between the source regions 16 with a predetermined length, respectively.

Figure 4:
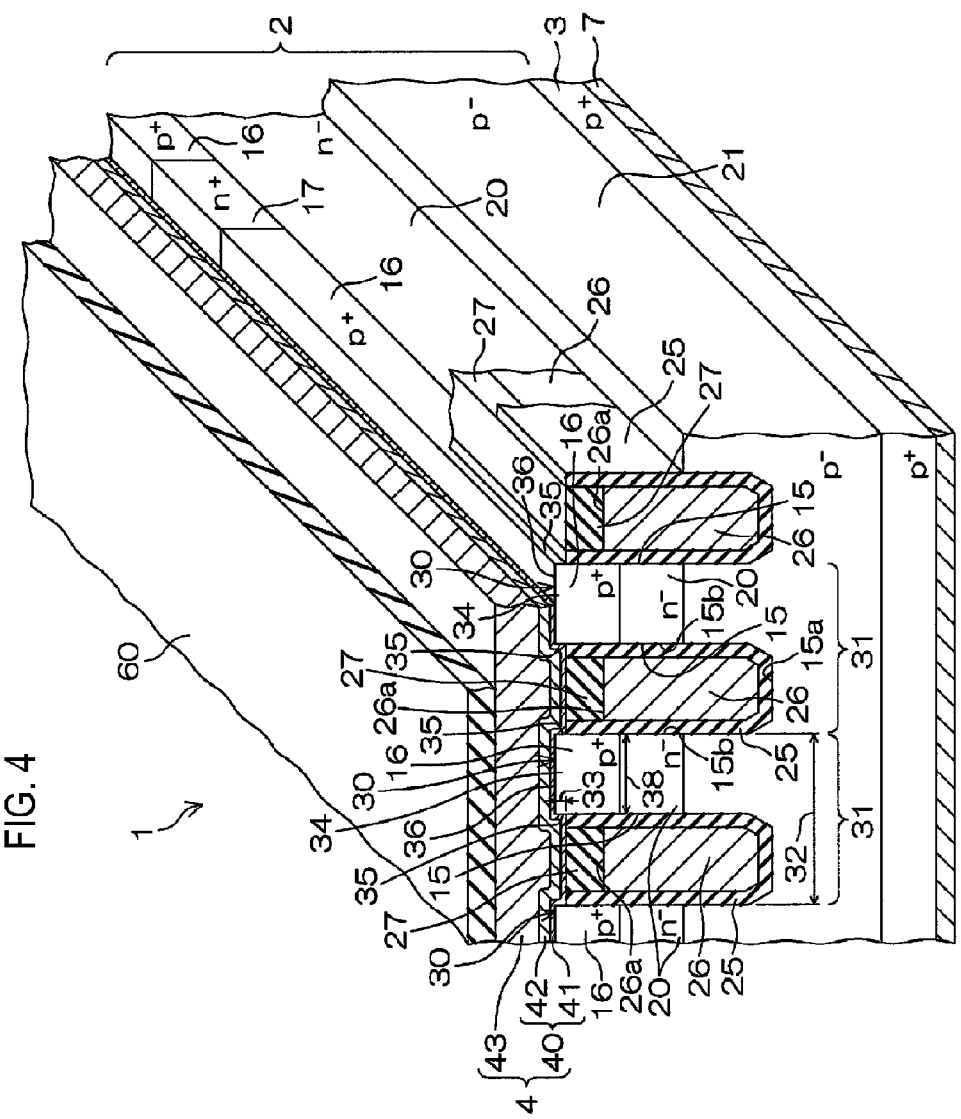
FIG. 4 is a schematic perspective view explaining an internal structure of the semiconductor device, in which a cross section taken along line IV-IV of FIG. 3 is schematically illustrated.

FIG. 4 is a schematic perspective view explaining an internal structure of the semiconductor device 1, in which a cross section taken along line IV-IV of FIG. 3 is schematically illustrated. The epitaxial layer 2 includes a p$^+$ type source region 16, an n$^-$ type channel region 20, and a p$^-$ type drain region 21 sequentially disposed from the surface of the semiconductor device 1 in the thickness direction of the silicon substrate 3. The thickness of the epitaxial layer 2 may be, for example, about 2 μm to 20 μm (more specifically, about 5 μm). Further, the thickness of the p$^+$ type source region 16 is, for example, about 0.85 μm, and that of the n$^-$ type channel region 20 is, for example, about 1.2 μm.

The trenches 15 are formed to be enchased to have a substantially rectangular shape in section from the surface of the epitaxial layer 2. A plurality of trenches 15 is formed to be parallel at a predetermined pitch (e.g., 0.4 μm to 0.52 μm, and more specifically, about 0.47 μm to 0.49 μm) in a direction parallel to a main surface of the silicon substrate 3. The plurality of trenches 15 has, for example, the same width (e.g., 0.14 μm to 0.27 μm, and more specifically, about 0.20 μm). Each trench 15 penetrates the source region 16 and the channel region 20 and has a depth (e.g., 1.6 μm to 2.4 μm, and more specifically, about 2.0 μm) reaching a middle portion of the drain region 21. In this configuration, the section of the trenches 15 crossing in the longitudinal direction has a substantially rectangular shape.

An inner wall face of each trench 15 is covered by a gate insulating layer 25. The gate insulating layer 25 is formed of, for example, a silicon oxide film, and a film thickness thereof may be about 200 Å to 240 Å. The gate insulating layer 25 is formed to cover a bottom face 15a and side walls 15b of each trench 15. A polysilicon gate 26 as a gate conductor is embedded to be in contact with the gate insulating layer 25 within each trench 15. The polysilicon gate 26 is embedded in each trench 15 such that the entirety thereof is positioned below the surface of the epitaxial layer 2 (the surface of the source region 16). Within each trench 15, for example, an insulating layer 27 formed of a high density plasma chemical vapor deposition (HDPCVD) oxide film is buried in a space above the polysilicon gate 26.

The polysilicon gate 26 is disposed to face a lower portion of the source region 16, the channel region 20, and an upper portion of the drain region 21. The gate insulating layer 25 is interposed therebetween. In other words, the polysilicon gate 26 is formed to face the channel region 20 through the gate insulating layer 25 in the transverse direction. The polysilicon gate 26 is placed over the entire region of the silicon substrate 3 in the thickness direction. Namely, a surface 26a of the polysilicon gate 26 is positioned in the vicinity of the surface of the epitaxial layer 2, and it is higher than an interface of the source region 16 and the channel region 20 in the thickness direction.

The epitaxial layer 2 between adjacent trenches 15 forms the active region 30 operating as a transistor. For example, it may be considered that the polysilicon gate 26 within one trench 15 and the active region 30 adjacent to one side of the polysilicon gate 26 form a unit cell 31. In other words, the unit cell 31 constitutes a repeating unit which is repeated by a formation pitch 32 of the trench 15. That is, a plurality of unit cells 31 are arranged at a pitch 32 in a direction perpendicular to a longitudinal direction and a depth direction of each trench 15 (direction parallel to the main surface of the semiconductor substrate 3).

The pitch 32 may be 0.4 μm to 0.52 μm (more specifically, 0.4 μm to 0.49 μm). Further, the active region 30 between adjacent trenches 15 may have a width 38 of 0.18 μm to 0.30 μm (more specifically, 0.18 μm to 0.24 μm).

The source regions 16 and the n$^+$ type body contact regions 17 are alternately formed in the longitudinal direction of the trenches 15 on the outermost surface region of the active region 30. The n$^+$ type body contact regions 17 are in contact with the n$^-$ type channel region 20. The active region 30 is formed to protrude by a protrusion amount 33 along the depth direction of the trench 15 more than the surface of the insulating layer 27. In other words, the active region 30 includes a protrusion 34 protruded by the protrusion amount 33 higher than the surface of the insulating layer 27 in the depth direction of the trench 15. The protrusion amount 33 may be, for example, 25 nm to 125 nm. The protrusion 34 may include a pair of standing sides 35 extending from the surface of the insulating layer 27 at both side portions of the trench 15 in the longitudinal direction, and a ceiling face 36 coupling the pair of standing sides 35. In FIG. 4, it is illustrated that the standing sides 35 and the ceiling face 36 are substantially perpendicular, however in an actually manufactured semiconductor device, a coupling portion of the standing sides 35 and the ceiling face 36 has a chamfered shape (curved face). Further, the ceiling face 36 may form an upwardly convex curved face (e.g., a substantially arc face). The boundary of the standing sides 35 and the ceiling face 36 is not necessarily clear, and they may form a single continuous curved face (e.g., a substantially arc face).

The source electrode 4 is formed to cover the surfaces of the protrusion 34 of the active region 30 and the insulating layer 27 within the trench 15. The source electrode 4 is configured as a stacked structure film formed by stacking a base film 40 and an electrode main body film 43. The base film 40 is configured as a stacked film including an adhesion layer 41 and a barrier layer 42.

The adhesion layer 41 is in contact with the insulating layer 27 and the protrusion 34 of the active region 30 and it is formed of a metal layer which has good adhesion to the insulating layer 27 and the protrusion 34. More specifically, the adhesion layer 41 is configured as a metal layer which is able to become silicidized in a contact portion (interface region) of the active region 30. The metal layer may be, for example, a Ti layer, a Co layer, or an Ni layer. For example, a Ti layer having a film thickness of about 70 Å may constitute the adhesion layer 41.

The barrier layer 42 is formed to come in contact with the adhesion layer 41 and cover the surface of the adhesion layer 41. The barrier layer 42 is made of a material which has conductivity and barrier characteristics for preventing a constituent material (e.g., an aluminum copper (AlCu) alloy) of the electrode main body film 43 from spreading to the active region 30 side. The barrier layer 42 may be, for example, a TiN layer, and may have a film thickness of about 1000 Å.

The electrode main body film 43 is formed to come in contact with the barrier layer 42 and cover an upper surface of the barrier layer 42. The electrode main body film 43 may be formed of, for example, an AlCu alloy film, and may have a film thickness of about 4.2 μm.

The source electrode 4 is electrically connected to the source region 16 and the body contact region 17. Thus, the source region 16 and the channel region 20 are controlled to be applied with the same potential.

The protrusion amount 33 of the protrusion 34 of the active region 30 may be 25 nm to 125 nm. In some embodiment, if the protrusion amount 33 is less than 25 nm, a contact area between the active region 30 and the adhesion layer 41 would be possibly insufficient, resulting in possible damage to the reliability of electrical connection between the active region 30 and the source electrode 4. Further, in other alternate embodiments, if the protrusion amount 33 exceeds 125 nm, the coverage of the adhesion layer 41 with respect to the protrusion 34 would possibly deteriorate.

A contact hole is formed at a position (not shown in FIG. 4) of the insulating layer 27. The polysilicon gate 26 and the gate electrode 5 are electrically connected through the contact hole. More specifically, as shown in the plan view of FIG. 2, the surface region of the epitaxial layer 2 is divided into a plurality of (three in this embodiment) cell formation regions 23 by the outer circumferential electrode part 9 and the gate finger parts 10. Each cell formation region 23 is a substantially rectangular region. Each trench 15 is formed to extend in parallel to a pair of shorter sides of the rectangular shape, and a plurality of trenches 15 are arranged with equal space along the pair of longer sides of the rectangular shape of the semiconductor device 1. Both ends of each trench 15 are electrically connected to the outer circumferential electrode part 9 or the gate finger parts 10, respectively.

When the semiconductor device 1 is used, a voltage is applied to the source electrode 4 and the drain electrode 7 to make the polarity of the source electrode 4 positive. In this state, if a potential lowered by a threshold value voltage than that of the source electrode 4 is applied to the gate electrode 5, an inversion layer (channel) is formed in an area of the channel region 20 facing the polysilicon gate 26. In other words, a majority of carriers (electrons) within the n⁻ type channel region 20 moves away from the polysilicon gate 26 to form a depletion layer. Therefore, the density of holes as minority carriers becomes higher than that of the electrons in the area of the channel region 20 near the side walls of the trench 15, resulting in formation of an inversion layer. The source region 16 and the drain region 21 are electrically connected through the inversion layer, forming a current path between the source electrode 4 and the drain electrode 7. A current between the source and drain electrodes varies depending on the size of voltage applied to the gate electrode 5. If voltage is not applied to the gate electrode 5, the source and the drain electrodes are disconnected due to the disappearance of the inversion layer. Thus, the transistor operation is realized.

Figure 5:
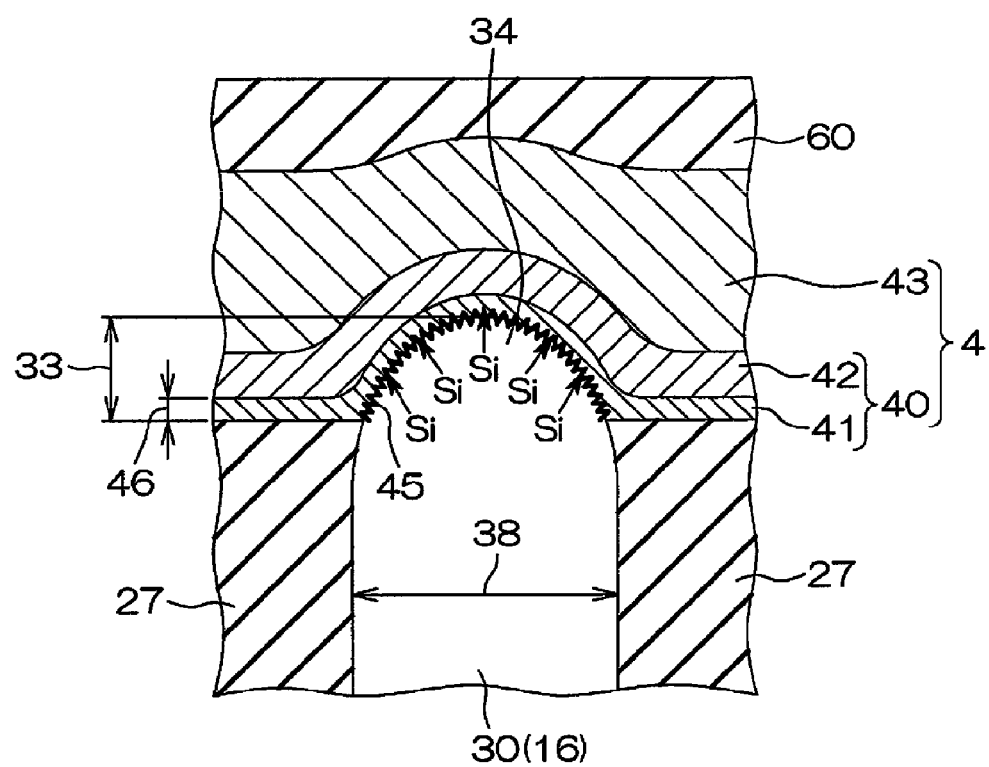
FIG. 5 is an enlarged schematic sectional view showing the structure of a source electrode of the semiconductor device.

FIG. 5 is an enlarged schematic sectional view showing the structure of the source electrode 4. The adhesion layer 41 is in contact with the protrusion 34 of the active region 30. A silicide 45 is formed in the vicinity of the interface between the active region 30 and the adhesion layer 41. The adhesion layer 41 and the active region 30 are in ohmic-contact by means of the silicide 45. Since the protrusion 34 is protruded more than the surface of the insulating layer 27, the contact area between the adhesion layer 41 and the active region 30 is increased to be larger than an apparent surface area of the active region 30 when viewed from the plane. Accordingly, the adhesion layer 41 can be in contact with the active region 30 by a large contact area. As a result, contact resistance between the adhesion layer 41 and the active region 30 can be reduced. Further, the adhesion layer 41 and the active region 30 in some embodiments can make reliable contact independent of processing dimension accuracy in the manufacturing process.

The adhesion layer 41 is formed of a metal layer having a film thickness 46 of 150 Å or smaller. If the film thickness of the adhesion layer 41 exceeds 150 Å (e.g., about 280 Å) and the silicide 45 is formed through a thermal treatment, a void may be created between the adhesion layer 41 and the active region 30 because of the insufficient supply of silicon atoms from the active region 30.

The adhesion layer 41 may have a film thickness of 20 Å or greater (more specifically, 40 Å or greater). Based on the configuration, excellent adhesion between the source electrode 4 and the active region 30 can be obtained and a silicide layer sufficient to reduce contact resistance therebetween can be formed in the interface therebetween.

Figure 6A:
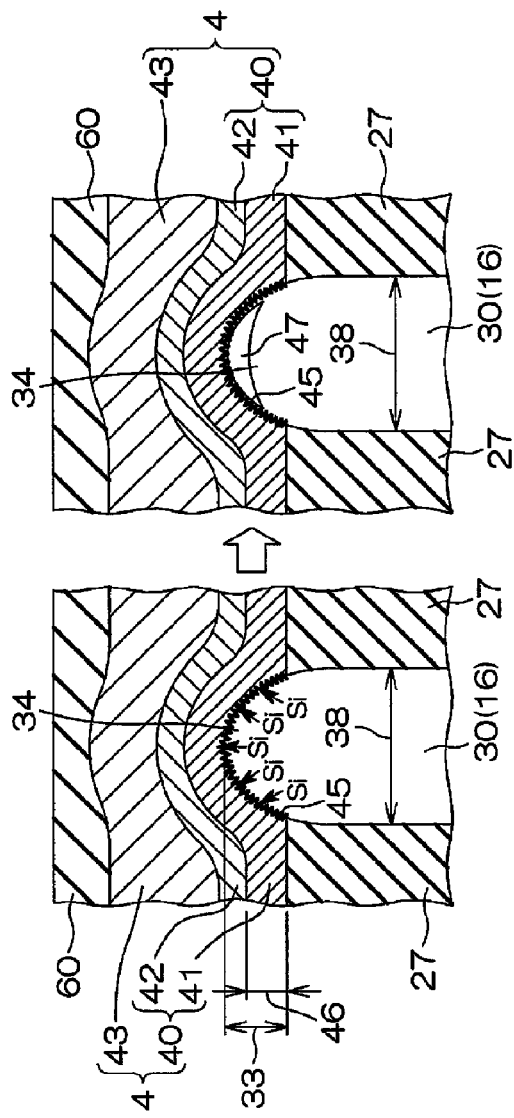
FIG. 6A is a schematic sectional view explaining a mechanism of creating a void when a film thickness of an adhesion layer of the source electrode exceeds 150 Å (e.g., 280 Å)

FIG. 6A is a view explaining a mechanism of creating a void if a film thickness of the adhesion layer 41 exceeds 150 Å (e.g., 280 Å). A current density per unit area may be increased by reducing a cell pitch and arranging the unit cells 31 with a high density. In this case, however, depending on the reduction in the cell pitch 32, the width 38 of the active region 30 is reduced to be, for example, about 270 nm. Thus, the number of silicon atoms within the active region 30 in the vicinity of the interface of the adhesion layer 41 is relatively small. In other words, a silicon atom supply window from the active region 30 to the adhesion layer 41 is small. Meanwhile, if the film thickness 46 of the adhesion layer 41 becomes large, the number of atoms being silicidized, among the metal atoms constituting the adhesion layer 41, is increased. However, the plurality of silicon atoms cannot be supplied from the active region 30 with a small width 38 to the adhesion layer 41. Thus, the insufficient supply of silicon atom may cause a void 47 to be created between the active region 30 and the adhesion layer 41. Accordingly, ON resistance of the semiconductor device 1 is increased, because the contact resistance between the adhesion layer 41 and the active region 30 is increased.

Figure 6B:
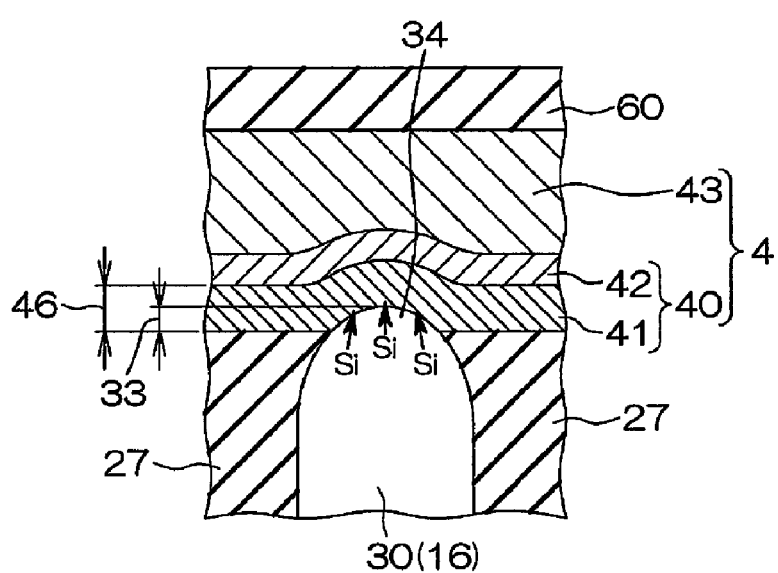
FIG. 6B is a schematic sectional view showing a configuration when a contact area between the adhesion layer and an active region is small.

As shown in FIG. 6B, if the contact area between the adhesion layer 41 and the active region 30 is adjusted to be small by reducing the protrusion amount 33 of the active region 30, the number of atoms being silicidized, among the constituent atoms of the adhesion layer 41, is reduced. As a result, a supply shortage of the silicon atoms does not happen, thus a void is not created. However, since the contact area between the active region 30 and the adhesion layer 41 is small, contact resistance therebetween is increased. In addition, due to a dimension error in the manufacturing process, if the active region 30 is embedded in the insulating layer 27, it is not possible to make the adhesion layer 41 and the active region 30 come into contact, resulting in possible contact failure.

Thus, in this embodiment, the protrusion amount 33 is incremented to increase the contact area between the active region 30 and the adhesion layer 41 and the film thickness of the adhesion layer 41 is adjusted to be 150 Å or smaller to restrain a formation of a void. Therefore, since the contact resistance between the adhesion layer 41 and the active region 30 can be reduced, and contact failure therebetween is reduced, reliability of the device can be secured.

FIG. 7 is a view showing the results obtained by measuring ON resistance with respect to a plurality of samples of the semiconductor device 1, in which a standard normal accumulation distribution is illustrated. A curved line L70 represents a standard normal accumulation distribution of ON resistance measured with respect to a plurality of samples in which the adhesion layer 41 was formed as a Ti layer having a film thickness of 70 Å. A curved line L120 represents a standard normal accumulation distribution of ON resistance measured with respect to a plurality of samples in which the adhesion layer 41 was formed as a Ti layer having a film thickness of 120 Å. A curved line L150 represents a standard normal accumulation distribution of ON resistance measured with respect to a plurality of samples in which the adhesion layer 41 was formed as a Ti layer having a film thickness of 150 Å. And, a curved line L280 represents a standard normal accumulation distribution of ON resistance measured with respect to a plurality of samples in which the adhesion layer 41 was formed as a Ti layer having a film thickness of 280 Å.

Based on the comparison of the curved lines, it can be seen that if the film thickness of the adhesion layer 41 was 280 Å, ON resistance was definitely increased in comparison to the case in which the film thickness of the adhesion layer 41 was 150 Å, and there is a great variation of the values of ON resistance. In comparison, when the film thickness of the adhesion layer 41 was 150 Å or smaller, it can be seen that ON resistance was distributed within a narrow range of 25 mΩ·mm² or smaller. Thus, it was confirmed that the semiconductor device 1 having high reliability with low ON resistance can be provided by adjusting the film thickness of the adhesion layer to be 150 Å or smaller.

Results obtained by requesting median values and standard deviations with respect to ON resistance in the respective film thicknesses of the adhesion layer are as follows.

70 Å: median value=14.2 mΩ·mm², standard deviation=0.3 mΩ·mm²
120 Å: median value=15.7 mΩ·mm², standard deviation=2.53 mΩ·mm²
150 Å: median value=15.9 mΩ·mm², standard deviation=3.42 mΩ·mm²
280 Å: median value=18.9 mΩ·mm², standard deviation=15.7 mΩ·mm²

Thus, in terms of the reduction of ON resistance and variation, it can be seen that the film thickness of the adhesion layer 41 may be 120 Å or smaller, and more specifically, 70 Å or smaller.

Further, it was confirmed according to the experiment by the inventor of the present disclosure that good ON resistance could be obtained and the variation of the ON resistance was small in the respective samples in which the adhesion layer 41 has a film thicknesses of 50 Å and 90 Å.

Figure 8A:
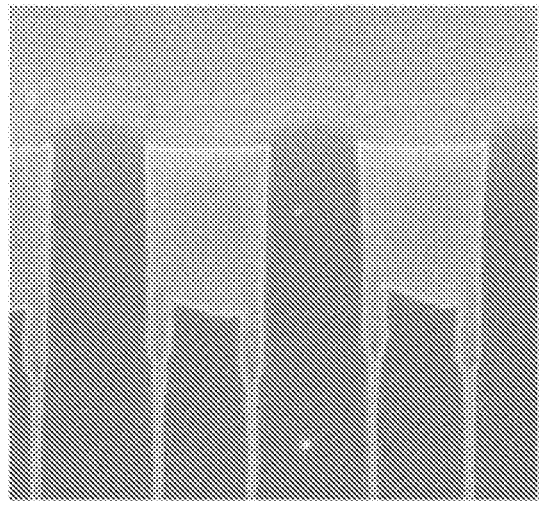
FIG. 8A is a scanning electron microscope (SEM) photograph showing a section of a sample (Embodiment) in which an adhesion layer of a source electrode is configured as a Ti layer having a film thickness of 70 Å.
Figure 8B:
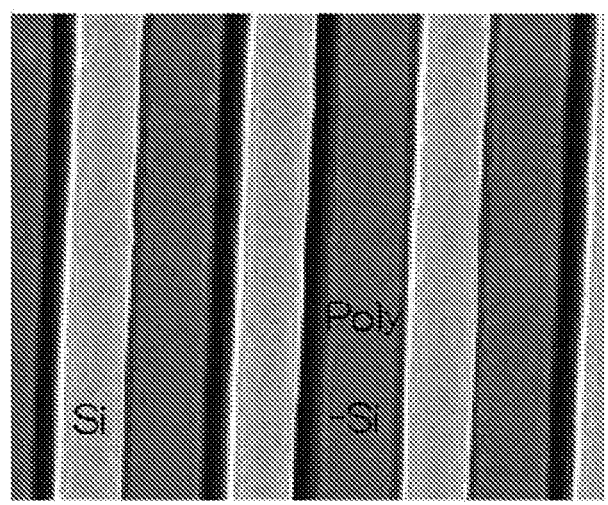
FIG. 8B is an SEM photograph showing a state of a surface of an epitaxial layer of the corresponding sample.
Figure 9A:
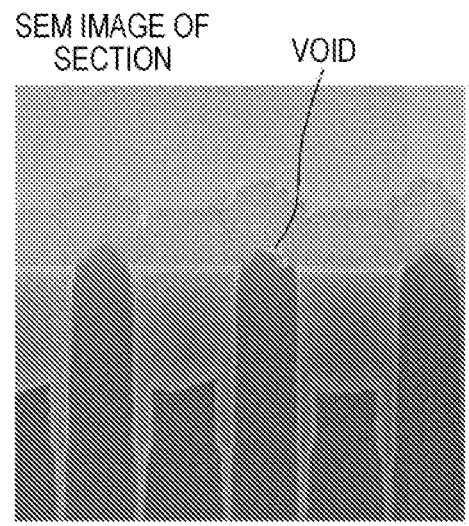
FIG. 9A is an SEM photograph showing a section of a sample (Comparative Example) in which an adhesion layer of a source electrode is configured as a Ti layer having a film thickness of 280 Å.
Figure 9B:
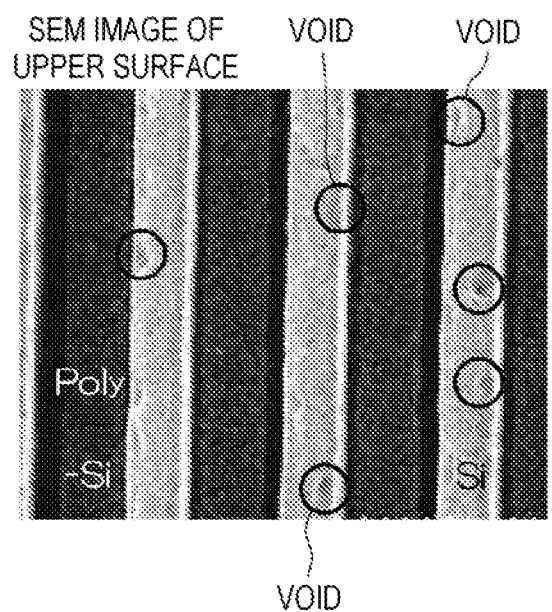
FIG. 9B is an SEM photograph showing a state of a surface of an epitaxial layer of the corresponding sample.

FIG. 8A is an SEM photograph showing a section of a sample (Embodiment) in which the adhesion layer 41 is configured as a Ti layer having a film thickness of 70 Å, and FIG. 8B is an SEM photograph showing a state of a surface of an epitaxial layer of the corresponding sample. Meanwhile, FIG. 9A is an SEM photograph showing a section of a sample (Comparative Example) in which the adhesion layer 41 is configured as a Ti layer having a film thickness of 280 Å, and FIG. 9B is an SEM photograph showing a state of a surface of an epitaxial layer of the corresponding sample. In the configuration of FIG. 9A, a void is created in the vicinity of the interface of the active region 30 and the adhesion layer 41. Such a void is not observed in the configurations of FIGS. 8A and 8B.

As mentioned above, according to the semiconductor device 1 of this embodiment, the source electrode 4 has the adhesion layer 41 in contact with the active region 30 (source region 16). The adhesion layer 41 is configured as a metal layer having a film thickness of 150 Å or smaller (specifically, 120 Å or smaller, and more specifically, 70 Å or smaller). With this configuration, when the interface portion of the adhesion layer 41 and the source region 16 becomes silicidized, a shortage of silicon atoms supplied from the active region 30 can be restrained or prevented. Accordingly, although the contact area between the active region 30 and the source electrode 4 is increased to secure reliability, a creation of a void in the interface of the active region 30 and the adhesion layer 41 can be restrained or prevented and the contact resistance between the active region 30 and the source electrode 4 can be reduced.

Thus, if the channel resistance is reduced by integrating the unit cells 31 with high density at a formation pitch ranging from 0.4 μm to 0.52 μm (more specifically, 0.4 μm to 0.49 μm) of the trenches 15, a drastic increase in the contact resistance of the source electrode 4 is not introduced. Therefore, the ON resistance of the semiconductor device 1 can be effectively reduced. In other words, by increasing the contact area between the active region 30 and the source electrode 4, the reliability can be secured and the ON resistance also can be reduced.

As mentioned above, the active region 30 between adjacent trenches 15 may have the width 38 of 0.18 μm to 0.30 μm (more specifically, 0.18 μm to 0.24 μm). If the width of the active region is smaller than 0.18 μm, the threshold voltage value may be reduced to easily couple a depletion layer spreading from a neighboring trench. In other words, if a voltage is applied to the gate electrode 5, majority carriers within the channel region 20 move away from the polysilicon gate 26, generating a depletion layer. Namely, the density of minority carriers becomes higher than that of majority carriers, forming an inversion layer within the channel region 20 in the vicinity of the side wall of the trench 15. If, however, the width of the active region 30 is too small, an inversion layer is formed with a low voltage to easily couple the depletion layer spreading from the neighboring trench 15. Thus, the threshold value is lowered. Meanwhile, in the case in which the width of the active region exceeds 0.30 μm, although the adhesion layer 41 is a metal layer having a thickness exceeding 150 Å, a void can be hardly created.

Further, according to this embodiment, the active region 30 has the protrusion 34 protruded in the depth direction of the trench 15 by the protrusion amount 33 of 25 nm to 125 nm higher than the surface of the insulating layer 27 embedded in the trench 15. Accordingly, although the width of the active region 30 is small, the contact area between the active region 30 and the adhesion layer 41 can become large. Even in the case of securing the large contact area in this manner, since the adhesion layer 41 is configured as a metal layer having a thickness of 150 Å or smaller, a creation of a void resulting from a shortage of silicon supply during silicidation can be restrained or prevented.

Figure 10A:
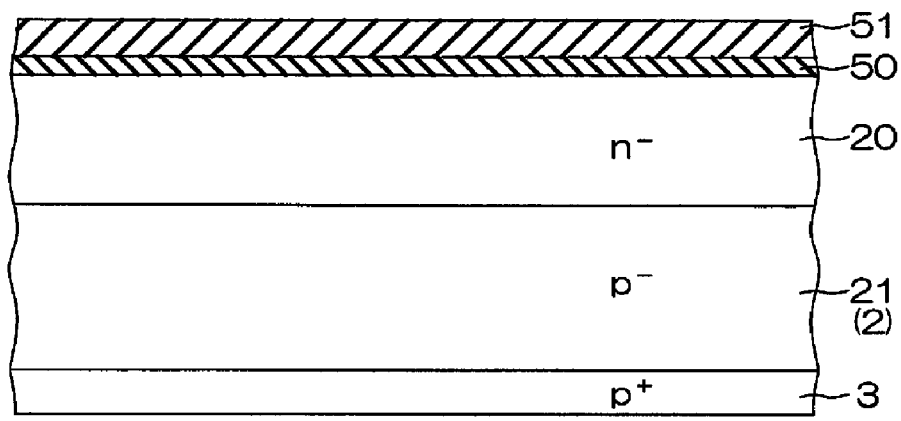
FIG. 10A is a schematic sectional view showing a fabrication process of the semiconductor device.

FIGS. 10A to 10M are schematic sectional views sequentially showing a manufacturing process of the semiconductor device 1. As shown in FIG. 10A, the p⁺ type silicon substrate 3 with the p⁻ type epitaxial layer 2 formed on the surface thereof is prepared. And, the pad oxide film 50 made of, e.g., silicon oxide is formed on the surface of the epitaxial layer 2 through thermal oxidation. Next, n type impurity ions (e.g., phosphorus ions) are implanted and spread on the p⁻ type epitaxial layer 2 to form the n⁻ type channel region 20. Further, n type impurity ions (e.g., phosphorus ions) are selectively implanted and spread on the outermost surface of the epitaxial layer 2 to form the n⁺ type body contact region 17

(see FIGS. 3 and 4). Thereafter, a hard mask layer 51 made of, e.g., silicon nitride is formed on the pad oxide film 50. The formation of the hard mask layer 51 may be executed through, for example, decompression chemical vapor deposition (CVD).

Figure 10B:
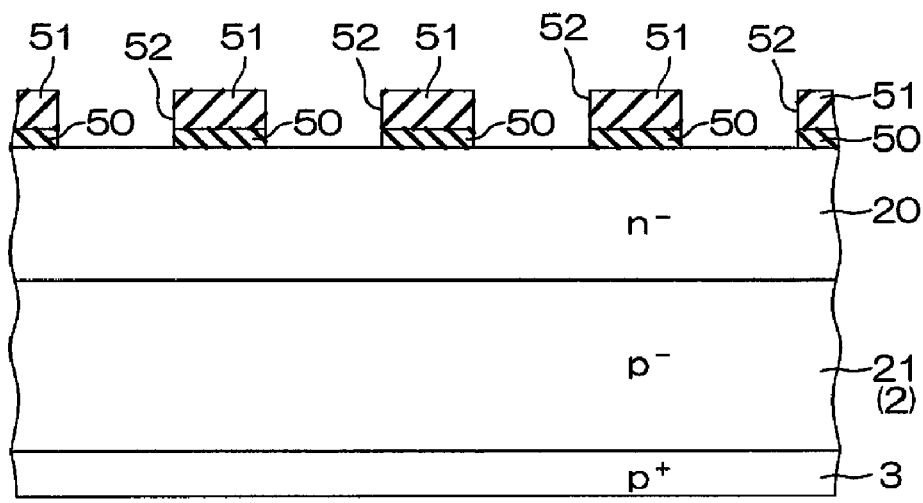
FIG. 10B is a schematic sectional view showing a process subsequent to FIG. 10A.
Figure 10C:
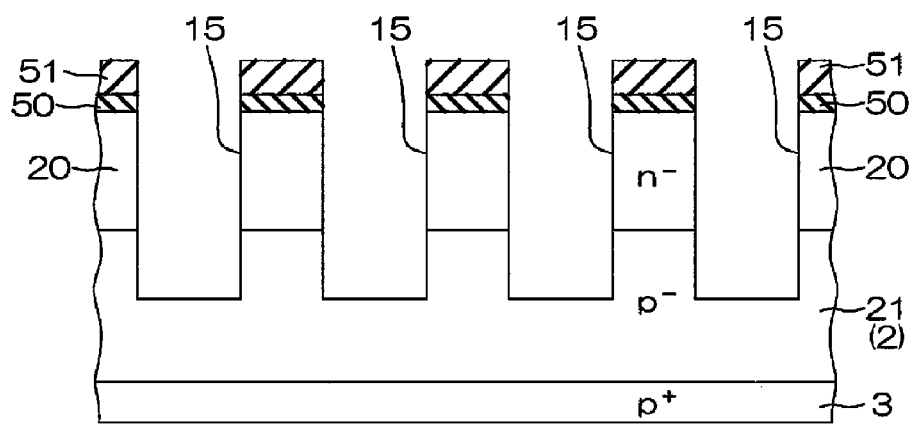
FIG. 10C is a schematic sectional view showing a process subsequent to FIG. 10B.

Next, as shown in FIG. 10B, openings 52 corresponding to the trenches 15 (see FIG. 4, etc.) are formed on the hard mask layer 51 and the pad oxide film 50. The formation of the openings 52 is executed by selectively eliminating the hard mask layer 51 and the pad oxide film 50 through, for example, reactive ion etching. And, as shown in FIG. 10C, dry etching is performed by using the hard mask layer 51 as a mask to form the plurality of trenches 15 having a stripe shape. The trenches 15 are formed to have a depth reaching the drain region 21 through the channel region 20.

Figure 10D:
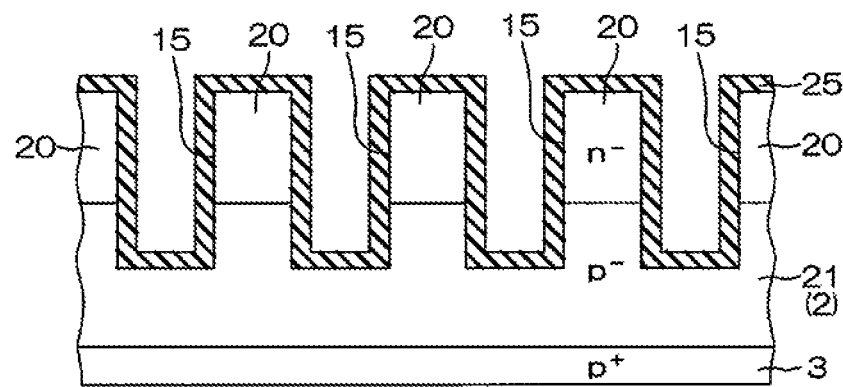
FIG. 10D is a schematic sectional view showing a process subsequent to FIG. 10C.

Next, as shown in FIG. 10D, the hard mask layer 51 and the pad oxide film 50 are delaminated, and the gate insulating layer 25 is formed on the entire surface of the exposed epitaxial layer 2. The formation of the gate insulating layer 25 may be executed through, for example, thermal oxidation. The gate insulating layer 25 may be made of, for example, silicon oxide having a film thickness of about 220 Å. In this manner, the gate insulating layer 25, which covers the inner wall faces of the trenches 15 and the surface of the epitaxial layer 2 outside the trenches 15, is formed.

Figure 10E:
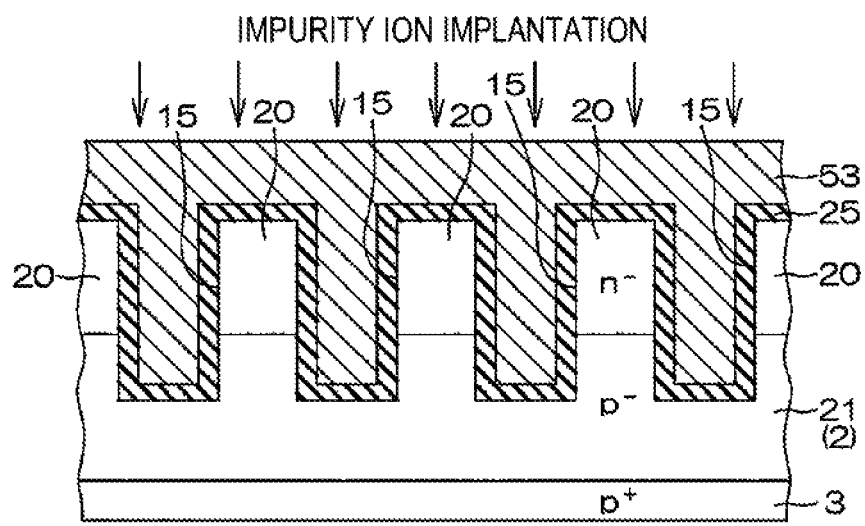
FIG. 10E is a schematic sectional view showing a process subsequent to FIG. 10D.

Next, as shown in FIG. 10E, the polysilicon film 53 is formed on the entire region of the epitaxial layer 2. The formation of the polysilicon film 53 may be executed through, for example, decompression CVD. A film thickness of the polysilicon film 53 may be, for example, about 6000 Å. Further, impurity ions (e.g., boron ions) providing conductivity to the polysilicon film 53 are implanted, and then, a thermal treatment is executed. Accordingly, the polysilicon film 53 has low resistance.

Figure 10F:
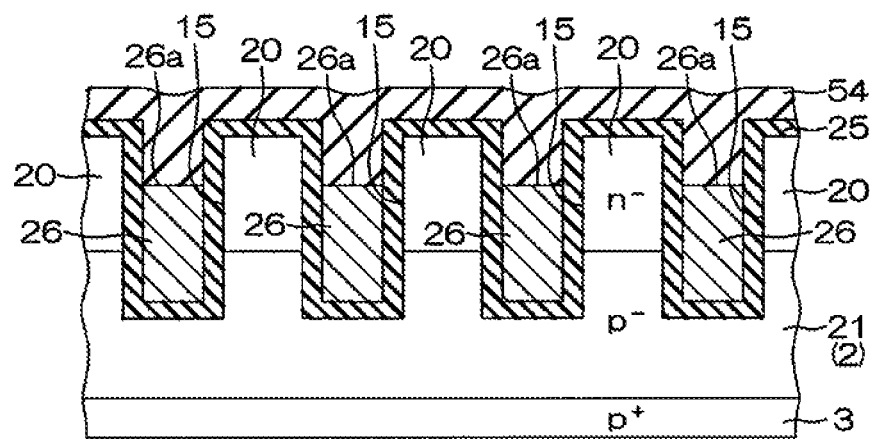
FIG. 10F is a schematic sectional view showing a process subsequent to FIG. 10E.

Next, as shown in FIG. 10F, the polysilicon film 53 is etched. This etching may include a process of making the polysilicon film 53 thin through, for example, reactive ion etching and a process of eliminating remaining polysilicon from side wall portions of the trenches 15 through plasma etching (isotropic etching). Etching of the polysilicon film 53 is executed until the surface of the polysilicon film is moved back to a position deeper than the surface of the epitaxial layer 2. Thus, the polysilicon gate 26 having a surface 26a is disposed at a position deeper than the surface of the epitaxial layer 2 within each trench 15. Thereafter, a protective film 54 is formed on the entire surface of the polysilicon gate 26 and the gate insulating layer 25 to protect the surface thereof during ion implantation. The protective film 54 may be formed of an oxide film such as a tetra ethoxy silane (TEOS) oxide film (i.e., a silicon oxide film formed according to a reaction of tetra ethoxy silane and oxygen), etc.

Next, as shown in FIG. 10G, a resist mask 55 is formed on the protective film 54. The resist mask 55 has a resist pattern including an opening corresponding to a region to form the source region 16 (See FIG. 4) in the active region 30. P type impurity ions (e.g., boron ions) are implanted through the resist mask 55.

Next, as shown in FIG. 10H, the protective film 54 is delaminated. Further, thermal oxidation is executed to form a thermal oxide film 56 on the surface of the source region 16 (i.e., the surface of the active region). When the protective film 54 is delaminated, the gate insulating layer 25 in the vicinity of the surface of the source region 16 is simultaneously delaminated. Thus, the exposed surface of the source region 16 is covered by the thermal oxide film 56.

Figure 10I:
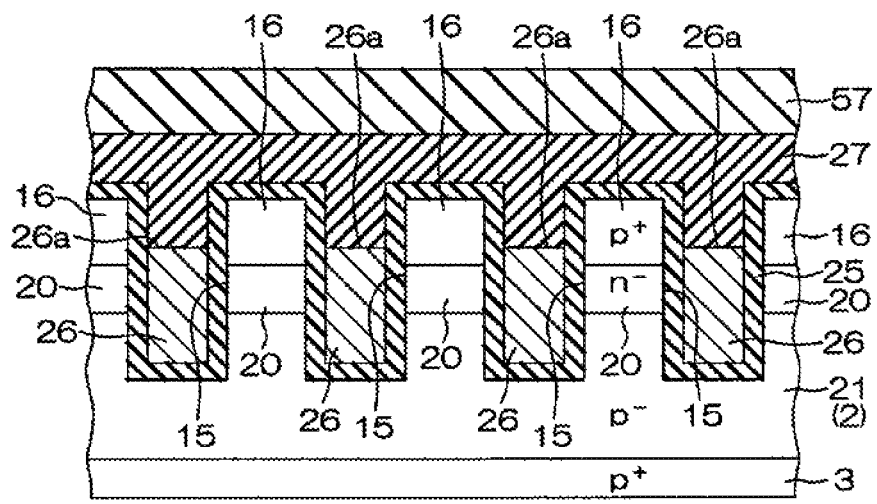
FIG. 10I is a schematic sectional view showing a process subsequent to FIG. 10H.

Next, as shown in FIG. 10I, the insulating layer 27 is formed through, for example, high density plasma CVD (HD-PCVD). The insulating layer 27 is made of, for example, a silicon oxide. Further, an interlayer 57 (e.g., boron-phosphorous silicate glass (BPSG)) is formed to cover the surface of the insulating layer 27. Thereafter, a thermal treatment is executed to move the interlayer 57. Thus, the p type impurity ions implanted in the source region 16 are simultaneously implanted.

Next, at a position (not shown), a gate contact hole is formed as an opening in the insulating layer 27 and the interlayer 57. The gate contact hole is formed at an upper portion of both ends of each trench 15 and reaches the polysilicon gate 26.

Figure 10J:
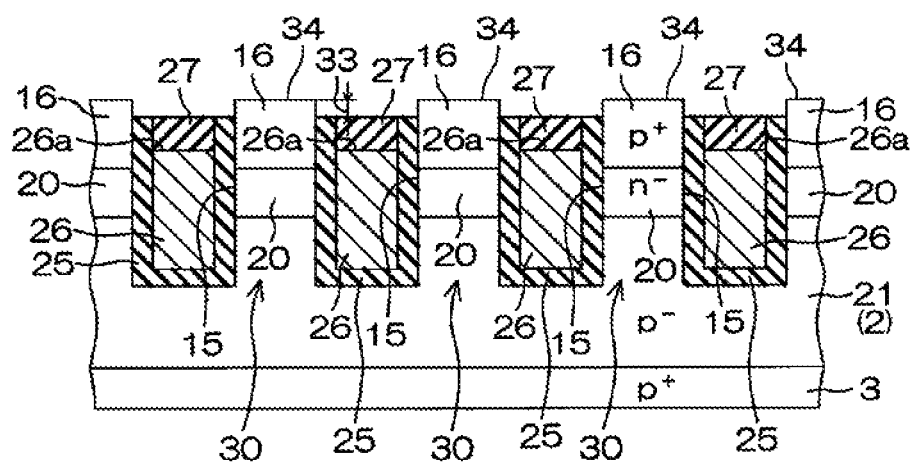
FIG. 10J is a schematic sectional view showing a process subsequent to FIG. 10I.

Next, as shown in FIG. 10J, etching is executed to expose the active region 30 (epitaxial layer 2) in other regions other than the regions in the vicinity of both end portions of the trenches 15. In other words, the interlayer 57 and the insulating layer 27 are selectively etched and the active region 30 (epitaxial layer 2) protrudes by the certain protrusion amount 33 higher than the surface of the insulating layer 27. Thus, the protrusion 34 is formed to protrude higher than the surface of the insulating layer 27 buried within each trench 15.

Figure 10K:
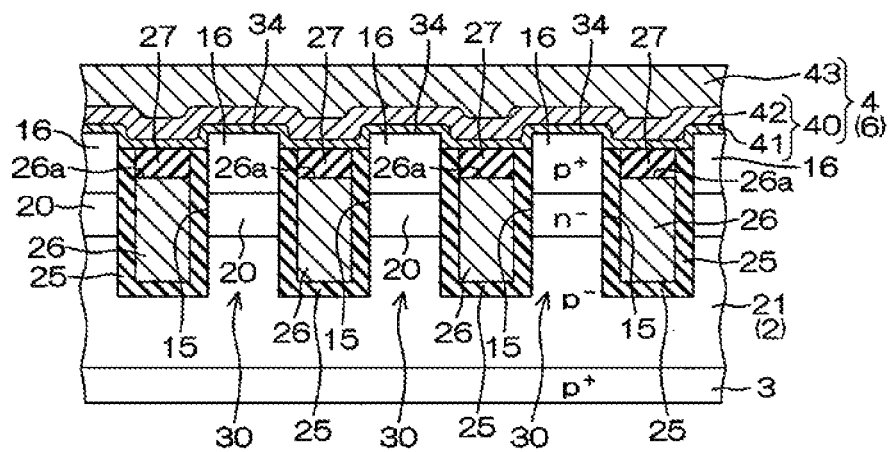
FIG. 10K is a schematic sectional view showing a process subsequent to FIG. 10J.

Next, as shown in FIG. 10K, the adhesion layer 41 is formed on the entire exposed surface regions, namely, the surfaces of the active region 30 and the insulating layer 27, and the barrier layer 42 is formed on the entire surface regions of the adhesion layer 41. The formation of the adhesion layer 41 and the barrier layer 42 may be executed through, for example, continuous sputtering. The adhesion layer 41 may be, for example, a Ti layer having a film thickness of about 70 Å, and the barrier layer 42 may be, for example, a TiN layer having a film thickness of about 1000 Å. Thereafter, for example, a thermal treatment (e.g., 660 degrees C.) such as rapid thermal annealing (RTA) is executed to be silicidized in the region of the adhesion layer 41, which comes in contact with the active region 30. Then, the electrode main body film 43 is formed on the entire region of the barrier layer 42. The electrode main body film 43 may be, for example, an AlCu film formed through sputtering. A film thickness of the electrode main body film 43 is, for example, 4.2 µm.

Next, the electrode film 6 formed on the entire surface includes the adhesion layer 41, the barrier layer 42, and the electrode main body film 43. The electrode film 6 is selectively etched to be eliminated in the separation region 11 illustrated in FIG. 2. Thus, the electrode film 6 is divided into the source electrode 4 and the gate electrode 5. The foregoing etching may be executed as, for example, reactive ion etching.

Figure 10L:
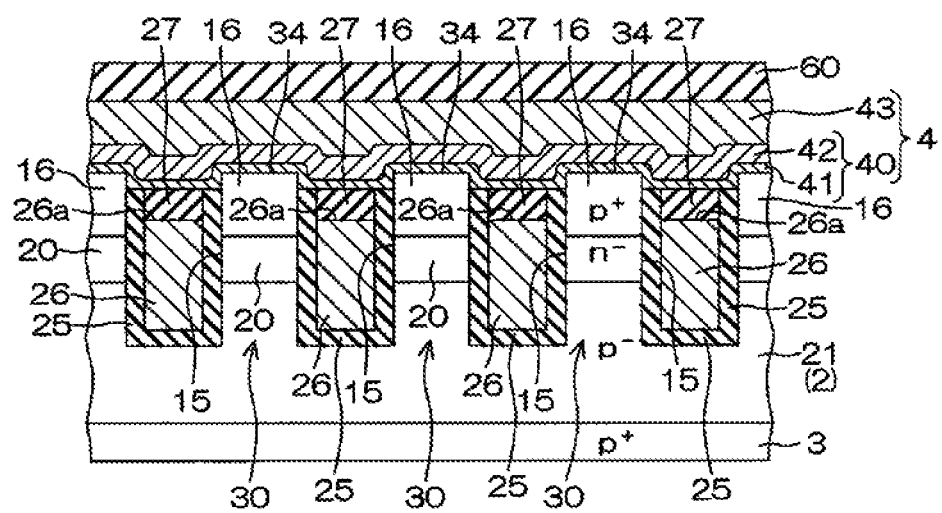
FIG. 10L is a schematic sectional view showing a process subsequent to FIG. 10K.

Thereafter, as shown in FIG. 10L, a passivation film 60 is formed on the entire surface of the electrode main body film 43. The passivation film 60 may be, for example, a silicon nitride film formed through CVD.

Figure 10M:
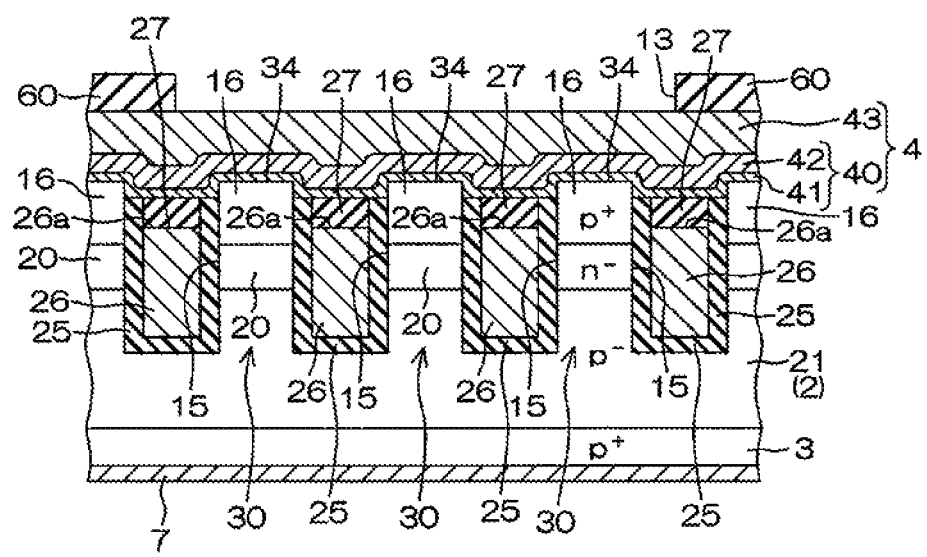
FIG. 10M is a schematic sectional view showing a process subsequent to FIG. 10L.

Next, as shown in FIG. 10M, the gate pad opening (see FIG. 2) and the source pad openings 13 are formed on the passivation film 60.

Thereafter, as necessary, a rear side of the silicon substrate 3 is polished to make the silicon substrate 3 thinner, and then, the drain electrode 7 is formed on the rear surface of the silicon substrate 3. For example, the drain electrode 7 may have a stacked layer structure in which a Ti film, an Ni film, an Au film, and an Ag film are sequentially stacked starting from the surface of the silicon substrate 3.

In this manner, the semiconductor device 1 having such a structure as illustrated in FIGS. 1 to 4, etc. can be obtained.

One embodiment of the present disclosure has been described so far, but the present disclosure may be embodied in a different form. For example, in the foregoing embodiment, the p channel type MOSFET is illustrated, however an n channel type MOSFET may be provided by inverting the conductivity type of each part in the foregoing embodiment.

Further, in the foregoing embodiment, the MOSFET is taken as an example, however the present disclosure can also be applicable to a semiconductor device having a different structure such as an insulated gate bipolar transistor (IGBT) or the like. Other various design modifications may be made within the scope of matters described in the claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    an active region including a drain region, a channel region stacked on the drain region, and a source region stacked on the channel region, the active region being formed of a silicon semiconductor layer;
    a gate conductor embedded within a trench, the trench formed from the source region to the drain region penetrating through the channel region;
    a source electrode configured to come in contact with the source region, the source electrode including an adhesion layer formed of a metal layer having a film thickness of 150 Å or smaller, an interface between the source electrode and the source region being silicidized;
    a plurality of the trenches formed at intervals; and
    an insulating layer buried in a region on the gate conductor within the trench,
    wherein the active region between adjacent trenches has a width of 0.18 μm to 0.30 μm and
    wherein the active region has a protrusion protruded in a depth direction of the trench by a protrusion amount of 25 nm to 125 nm higher than a surface of the insulating layer.

2. The semiconductor device of claim 1, wherein a repeating unit including the trench and the active region is repeatedly formed by a pitch of 0.4 μm to 0.52 μm in a direction perpendicular to a depth direction of the trench.

3. The semiconductor device of claim 1, wherein the metal layer forming the adhesion layer is a Ti layer, a Co layer, or an Ni layer.

4. A trench gate type semiconductor device, comprising:
    an active region including a drain region, a channel region stacked on the drain region, and a source region stacked on the channel region, the active region being formed of a silicon semiconductor layer;
    a gate conductor embedded within a trench, the trench formed from the source region to the drain region penetrating through the channel region;
    an insulating layer buried within a region on the gate conductor in the trench; and
    a source electrode electrically connected to the source region;
    wherein the source region includes a protrusion protruded in a depth direction of the trench higher than the surface of the insulating layer,
    wherein the source electrode is configured to come in contact with the protrusion and includes an adhesion layer, a barrier layer stacked on the adhesion layer and an electrode main body film stacked on the barrier layer,
    wherein an interface between the protrusion and the adhesion layer is silicidized, and
    wherein the width of the adhesion layer is smaller than that of the barrier layer.

5. The semiconductor device of claim 4, wherein the protrusion has a chamfered shape.

6. The semiconductor device of claim 4, wherein a plurality of the trenches are formed at intervals, and the active region between adjacent trenches has a width of 0.18 μm to 0.30 μm.

7. The semiconductor device of claim 4, wherein the protrusion is protruded by a protrusion amount of 25 nm to 125 nm higher than a surface of the insulating layer.

8. The semiconductor device of claim 4, wherein the intervals of the trench and the active region is repeatedly formed by a pitch of 0.4 μm to 0.52 μm in a direction perpendicular to a depth direction of the trench.

9. The semiconductor device of claim 4, wherein the adhesion layer is formed of a metal layer and has a film thickness of 150 Å or smaller.

10. The semiconductor device of claim 4, wherein the metal layer forming the adhesion layer is a Ti layer, a Co layer, or an Ni layer.

11. A semiconductor device, comprising:
    an active region including a drain region, a channel region stacked on the drain region, and a source region stacked on the channel region, the active region being formed of a silicon semiconductor layer;
    a gate conductor embedded within a trench through an insulation film, the trench formed from the source region to the drain region penetrating through the channel region;
    an insulating layer embedded within a region on the gate conductor in the trench; and
    a source electrode electrically connected to the source region;
    wherein the source region includes a protrusion protruded in a depth direction of the trench from the surface of the insulating layer,
    wherein the source electrode includes an adhesion layer in contact with the protrusion, a barrier layer stacked on the adhesion layer and an electrode main body film stacked on the barrier layer, and
    wherein the width of the adhesion layer is smaller than that of the barrier layer.

12. The semiconductor device of claim 11, wherein the protrusion has a chamfered shape.

13. The semiconductor device of claim 11, wherein a plurality of the trenches are formed at intervals, and the active region between adjacent trenches has a width of 0.18 μm to 0.30 μm.

14. The semiconductor device of claim 11, wherein the protrusion is protruded by a protrusion amount of 25 nm to 125 nm higher than a surface of the insulating layer.

15. The semiconductor device of claim 11, wherein a repeating unit including the trench and the active region is repeatedly formed by a pitch of 0.4 μm to 0.52 μm in a direction perpendicular to a depth direction of the trench.

16. The semiconductor device of claim 11, wherein the adhesion layer is formed of a metal layer and has a film thickness of 150 Å or smaller.

17. The semiconductor device of claim 11, wherein the metal layer forming the adhesion layer is a Ti layer, a Co layer, or an Ni layer.

* * * * *